US009636709B2

(12) United States Patent
Yamamoto et al.

(10) Patent No.: US 9,636,709 B2
(45) Date of Patent: May 2, 2017

(54) ULTRASONIC GENERATION DEVICE

(71) Applicant: MURATA MANUFACTURING CO., LTD., Nagaokakyo-Shi, Kyoto-fu (JP)

(72) Inventors: Hironari Yamamoto, Nagaokakyo (JP); Akihiro Mitani, Nagaokakyo (JP)

(73) Assignee: MURATA MANUFACTURING CO., LTD., Ngaokakyo-Shi, Kyoto-Fu (JP)

( * ) Notice: Subject to any disclaimer, the term of this patent is extended or adjusted under 35 U.S.C. 154(b) by 673 days.

(21) Appl. No.: 14/223,357

(22) Filed: Mar. 24, 2014

(65) Prior Publication Data

US 2014/0203684 A1 Jul. 24, 2014

Related U.S. Application Data

(63) Continuation of application No. PCT/JP2012/074025, filed on Sep. 20, 2012.

(30) Foreign Application Priority Data

Oct. 3, 2011 (JP) ................................ 2011-219541

(51) Int. Cl.
*H01L 41/09* (2006.01)
*B06B 1/06* (2006.01)
(Continued)

(52) U.S. Cl.
CPC .......... *B06B 1/0607* (2013.01); *B06B 1/0603* (2013.01); *B06B 1/0618* (2013.01);
(Continued)

(58) Field of Classification Search
CPC ........................................................ G10K 9/22
(Continued)

(56) References Cited

U.S. PATENT DOCUMENTS 4,156,800 A * 5/1979 Sear ........................ H04R 1/406 310/322
6,445,108 B1 * 9/2002 Takeshima ............ B06B 1/0603 310/322

(Continued)

FOREIGN PATENT DOCUMENTS

JP 2004-297219 A 10/2004
JP 2010-187361 A 8/2010

(Continued)

OTHER PUBLICATIONS

Written Opinion and International Search Report issued in PCT/JP2012/074025 mailed on Dec. 11, 2012.

*Primary Examiner* — Thomas Dougherty
(74) *Attorney, Agent, or Firm* — Arent Fox LLP

(57) ABSTRACT

An ultrasonic generation device including an ultrasonic generation element having a frame, a first piezoelectric vibrator, and a second piezoelectric vibrator and configured to emit ultrasonic waves in a buckling tuning-fork vibration mode in which the first piezoelectric vibrator and the second piezoelectric vibrator vibrate in mutually opposite phases at the same frequency. Further, a housing receives the ultrasonic generation element and has ultrasonic emission ports, a first acoustic path extending from a vicinity of a vibration surface of the first piezoelectric vibrator to a vicinity of the ultrasonic emission ports, and a second acoustic path extending from a vicinity of a vibration surface of the second piezoelectric vibrator to the vicinity of the ultrasonic emission ports.

20 Claims, 12 Drawing Sheets

100

(51) Int. Cl.
*G10K 9/22* (2006.01)
*H04R 1/28* (2006.01)
*H04R 17/02* (2006.01)

(52) U.S. Cl.
CPC ................ *G10K 9/22* (2013.01); *H04R 1/288* (2013.01); *H04R 17/02* (2013.01)

(58) Field of Classification Search
USPC .......................................... 310/322, 330–334
See application file for complete search history.

(56) References Cited

U.S. PATENT DOCUMENTS

| | | | | |
|---|---|---|---|---|
| 8,400,363 | B2 | 3/2013 | Nam et al. | |
| 2014/0139071 | A1* | 5/2014 | Yamamoto | G10K 9/122 310/322 |
| 2014/0333182 | A1* | 11/2014 | Yamamoto | B06B 1/06 310/334 |

FOREIGN PATENT DOCUMENTS

| | | | |
|---|---|---|---|
| JP | 5-219588 | B2 | 6/2013 |
| JP | 5-344582 | B2 | 11/2013 |

* cited by examiner (A)

(B)

FREQUENCY-SOUND PRESSURE CHARACTERISTICS

RELATIONSHIP BETWEEN FREQUENCY DIFFERENCE BETWEEN TWO SOUND PRESSURE PEAKS AND FREQUENCY-SOUND PRESSURE CHARACTERISTICS

FREQUENCY DIFFERENCE BETWEEN TWO SOUND PRESSURE PEAKS AND TEMPERATURE-SOUND PRESSURE CHARACTERISTICS

SIZE OF ULTRASONIC EMISSION PORTS AND CHANGE IN FREQUENDCY-SOUND PRESSURE CHARACTERISTICS

SIZE OF PIEZOELECTRIC VIBRATOR AND CHANGE IN FREQUENCY-SOUND PRESSURE CHARACTERISTICS

PRIOR ART

FREQUENCY-SOUND PRESSURE CHARACTERISTICS

ULTRASONIC GENERATION DEVICE

CROSS REFERENCE TO RELATED APPLICATIONS

The present application is a continuation of PCT/JP2012/074025 filed Sep. 20, 2012, which claims priority to Japanese Patent Application No. 2011-219541, filed Oct. 3, 2011, the entire contents of each of which are incorporated herein by reference.

FIELD OF THE INVENTION

The present invention relates to an ultrasonic generation device, and more specifically, to an ultrasonic generation device that provides a high sound pressure and makes the output sound pressure stable to, for example, temperature change.

BACKGROUND OF THE INVENTION

Recently, a distance measuring method utilizing ultrasonic waves has been used as an accurate distance measuring method. In the method, ultrasonic waves are emitted from an ultrasonic generation device and are caused to impinge on an object to be measured. The ultrasonic waves reflected by the object are detected by an ultrasonic microphone device, and the distance to the object is calculated from the time elapsed between the emission and the detection.

For example, Patent Document 1 (Japanese Unexamined Patent Application Publication No. 2004-297219) discloses an ultrasonic generation device in which piezoelectric vibrators are attached to a housing. The device in Patent Document 1 is configured as an ultrasonic sensor device in which a single device serves as both an ultrasonic generation device and an ultrasonic microphone device.

FIG. 10 illustrates an ultrasonic generation device (ultrasonic sensor device) 200 disclosed in Patent Document 1. FIG. 10 is a cross-sectional view of the ultrasonic generation device 200. The ultrasonic generation device 200 has a structure in which a first piezoelectric vibrator 102 and a second piezoelectric vibrator 103, which vibrates in opposite phase from that of the first piezoelectric vibrator 102 to cancel unnecessary vibration, are attached to a housing 101. A lead 104 is connected to each of the housing 101, the first piezoelectric vibrator 102, and the second piezoelectric vibrator 103. An inner space of the housing 101 is filled with a flexible filler 105.

To make a measurement result more accurate and to lengthen a measurable distance in the distance measuring method using such an ultrasonic generation device, it is useful to increase an output sound pressure of the ultrasonic generation device.

However, increasing the output sound pressure in the ultrasonic generation device 200 is limited. That is, although increasing the output sound pressure requires that polarization of the piezoelectric vibrator be increased or electric power applied to the piezoelectric vibrator be enlarged, the polarization of the piezoelectric vibrator is limited. Further, if the applied electric power is excessively enlarged, the piezoelectric vibrator exceeds its breakdown limit. Hence, increasing the output sound pressure is limited.

In recent years, there is a strong demand to reduce the sizes of electronic apparatuses and devices. However, if the piezoelectric vibrator is miniaturized to reduce the size of the ultrasonic generation device, a problem arises in that the output sound pressure falls. Therefore, there also is a problem in that size reduction of the ultrasonic generation device is difficult.

Accordingly, the present applicant has addressed the development of an ultrasonic generation device having a high outpour sound pressure, and has succeeded in developing an ultrasonic generation device that has a high output sound pressure with a specific structure. Although a patent application on this ultrasonic generation device has been filed (for example, PCT/JP2011/68095), the application has not been laid open yet at the time of filing the present application.

FIG. 11 schematically illustrates an ultrasonic generation device 300 filed as a patent application (not laid open) by the present applicant. FIG. 11 is a cross-sectional view of the ultrasonic generation device 300. FIG. 11 simplifies and schematically illustrates details.

The ultrasonic generation device 300 includes an ultrasonic generation element 201.

The ultrasonic generation element 201 includes a frame 202, a first piezoelectric vibrator 203, and a second piezoelectric vibrator 204. The frame 202 has a through hole in its center portion. The first piezoelectric vibrator 203 is bonded to a lower principal surface of the frame 202, and the second piezoelectric vibrator 204 is bonded to an upper principal surface of the frame 202.

The first piezoelectric vibrator 203 and the second piezoelectric vibrator 204 are vibrated in mutually opposite phases by applying driving signals with the same frequency thereto. That is, the ultrasonic generation element 201 vibrates in a buckling tuning-fork vibration mode, and ultrasonic waves are generated from each of the first piezoelectric vibrator 203 and the second piezoelectric vibrator 204.

The ultrasonic generation device 300 further includes a housing composed of a substrate 207 and a cover member 208. The ultrasonic generation element 201 is mounted on the substrate 207 with pillow members 209, such as conductive adhesive, so that a gap is formed between the ultrasonic generation element 201 and the substrate 207. Further, the cover member 208 is bonded to the substrate 207. The cover member 208 has ultrasonic emission ports 208*b* from which the ultrasonic waves generated by the first piezoelectric vibrator 203 and the second piezoelectric vibrator 204 are emitted outside.

An acoustic path R201 is defined by a gap formed between the first piezoelectric vibrator 203 and the substrate 207 and a gap formed between an outer peripheral surface of the ultrasonic generation element 201 and an inner surface of the housing composed of the substrate 207 and the cover member 208. An acoustic path R202 is defined by a gap formed between the second piezoelectric vibrator 204 and the cover member 208. When the ultrasonic generation element 201 is driven, ultrasonic waves generated by the first piezoelectric vibrator 203 and ultrasonic waves generated by the second piezoelectric vibrator 204 reach the ultrasonic emission ports 208*b* via the acoustic path R201 and the acoustic path R202, respectively, and are combined into ultrasonic waves having a high output sound pressure. The ultrasonic waves are emitted outside from the ultrasonic emission ports 208*b*.

Patent Document 1: Japanese Unexamined Patent Application Publication No. 2004-297219

However, in the above-described ultrasonic generation device 300 whose patent application has been filed by the present applicant (not laid open), a zone where the output sound pressure becomes minimal exists at a frequency comparatively close to a frequency where the output sound pressure becomes maximal in the frequency-sound pressure characteristics. Hence, there is a problem in that the output sound pressure rapidly may fall according to the assembly accuracy, tolerance of components, or temperature change.

FIG. 12 shows the frequency-sound pressure characteristics of the ultrasonic generation device 300. As shown in FIG. 12, a peak of the sound pressure where the output sound pressure becomes maximal (hereinafter referred to as "low-frequency side peak Lp") exists near 40 kHz, a peak of the sound pressure where the output sound pressure becomes maximal (hereinafter referred to as "high-frequency side peak Hp") exists near 46 kHz, and a zone where the output sound pressure becomes minimal (hereinafter referred to as "anacoustic zone Ns") exists between the low-frequency side peak Lp and the high-frequency side peak Hp. The frequency-sound pressure characteristics are obtained by calculating the sound pressure at a position 20 cm apart from the ultrasonic generation device by FEM (finite element method) (this also applies to other graphs of "frequency-sound pressure characteristics" in the present application documents). However, since it is assumed that the amplitude of the vibrator is fixed over the entire frequency range to clarify the influence degree of resonance, the influence of resonance of the vibrator is not reflected herein.

The low-frequency side peak Lp is formed by resonance of air using the vicinity of a vibration surface of the first piezoelectric vibrator 203 as an antinode and each of the ultrasonic emission ports 208*b* as a node. At this time, ultrasonic waves that are generated in the first piezoelectric vibrator 203 and propagate through the acoustic path R201 and ultrasonic waves that are generated in the second piezoelectric vibrator 204 and propagate through the acoustic path R202 are in phase with each other.

The anacoustic zone Ns is formed when the ultrasonic waves that are generated in the first piezoelectric vibrator 203 and propagate through the acoustic path R201 and the ultrasonic waves that are generated in the second piezoelectric vibrator 204 and propagate through the acoustic path R202 are opposite in phase.

The high-frequency side peak Hp is formed by resonance of air using the vicinity of a vibration surface of the second piezoelectric vibrator 204 as an antinode and the vicinity of each of the pillow members 209 as a node. Although the resonance itself occurs within the ultrasonic generation device 300, since the vicinities of the ultrasonic emission ports 208*b* are open ends, ultrasonic waves having a comparatively high output sound pressure are emitted from the ultrasonic emission ports 208*b*. At this time, the ultrasonic waves that are generated in the first piezoelectric vibrator 203 and propagate through the acoustic path R201 and the ultrasonic waves that are generated in the second piezoelectric vibrator 204 and propagate through the acoustic path R202 are opposite in phase.

The ultrasonic generation device 300 most efficiently emits ultrasonic waves when the ultrasonic generation element 201 is driven at the frequency of the low-frequency side peak Lp where the output sound pressure becomes maximal. However, since the frequency of the low-frequency side peak Lp and the frequency of the anacoustic zone Ns are comparatively close to each other, as described above, there is a problem in that the output sound pressure rapidly may fall according to the assembly accuracy, tolerance of components, or temperature change.

SUMMARY OF THE INVENTION

The present invention has been made to solve the problem in the ultrasonic generation device whose patent application was filed by the present applicant (not laid open). As its means, an ultrasonic generation device according to the present invention includes an ultrasonic generation element including a frame having at least one of a groove and a through hole in a center portion thereof, a first piezoelectric vibrator shaped like a flat plate and bonded to one principal surface of the frame, and a second piezoelectric vibrator shaped like a flat plate and bonded to the other principal surface of the frame, the ultrasonic generation element emitting ultrasonic waves in a buckling tuning-fork vibration mode in which the first piezoelectric vibrator and the second piezoelectric vibrator vibrate in mutually opposite phases at the same frequency. The ultrasonic generation device further includes a housing that receives the ultrasonic generation element and has one or a plurality of ultrasonic emission ports, a first acoustic path extending from a vicinity of a vibration surface of the first piezoelectric vibrator to a vicinity of the one or the plurality of ultrasonic emission ports and defined by the ultrasonic generation element and an inner surface of the housing, and a second acoustic path extending from a vicinity of a vibration surface of the second piezoelectric vibrator to the vicinity of the one or the plurality of ultrasonic emission ports and defined by the ultrasonic generation element and the inner surface of the housing. Frequency-sound pressure characteristics representing a relationship between a vibration frequency of the first piezoelectric vibrator and the second piezoelectric vibrator and an output sound pressure of the ultrasonic waves emitted from the one or the plurality of ultrasonic emission ports include a low-frequency side peak and a high-frequency side peak. A frequency difference between the low-frequency side peak and the high-frequency side peak is 10 kHz or more.

Advantageous Effects of Invention

In the ultrasonic generation device of the present invention, the frequency-sound pressure characteristics representing the relationship between the vibration frequency of the first piezoelectric vibrator and the second piezoelectric vibrator and the output sound pressure of the ultrasonic waves emitted from the one or the plurality of ultrasonic emission ports include the low-frequency side peak and the high-frequency side peak, and the frequency difference between the low-frequency side peak and the high-frequency side peak is 10 kHz or more. Hence, for example, even when the temperature of a usage environment changes, the output sound pressure does not rapidly fall, and a stable output sound pressure can be maintained.

In the ultrasonic generation device of the present invention, the ultrasonic generation element includes the first piezoelectric vibrator and the second piezoelectric vibrator, both the vibrators are driven in the buckling tuning-fork vibration mode, and ultrasonic waves emitted from both the vibrators are combined and output. Hence, ultrasonic waves having a high output sound pressure can be emitted.

DETAILED DESCRIPTION OF THE PREFERRED EMBODIMENTS

An embodiment of the present invention will be described below with reference to the drawings.

Figure 1:
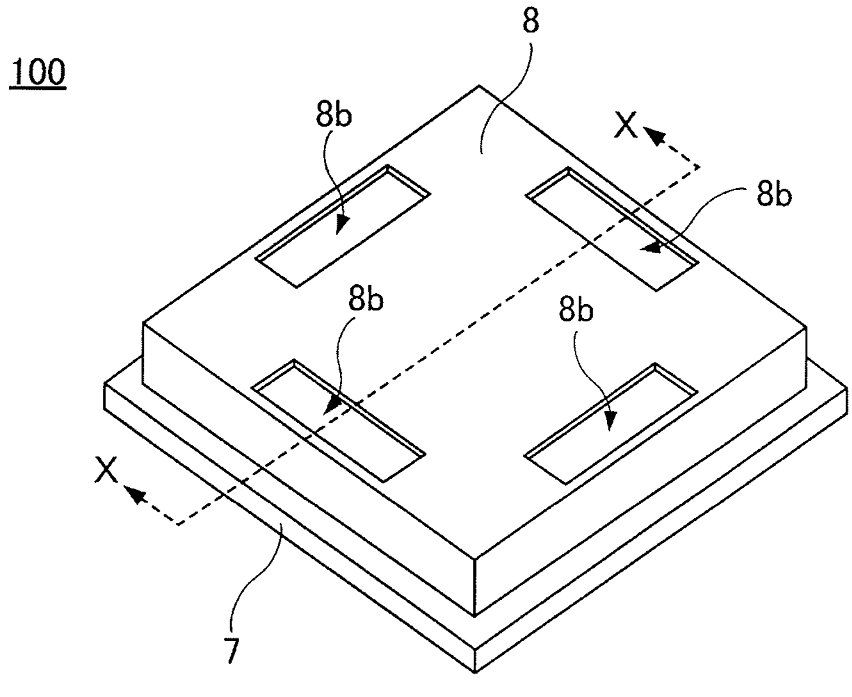
FIG. 1 is a perspective view of an ultrasonic generation device 100 according to an embodiment of the present invention.
Figure 2:
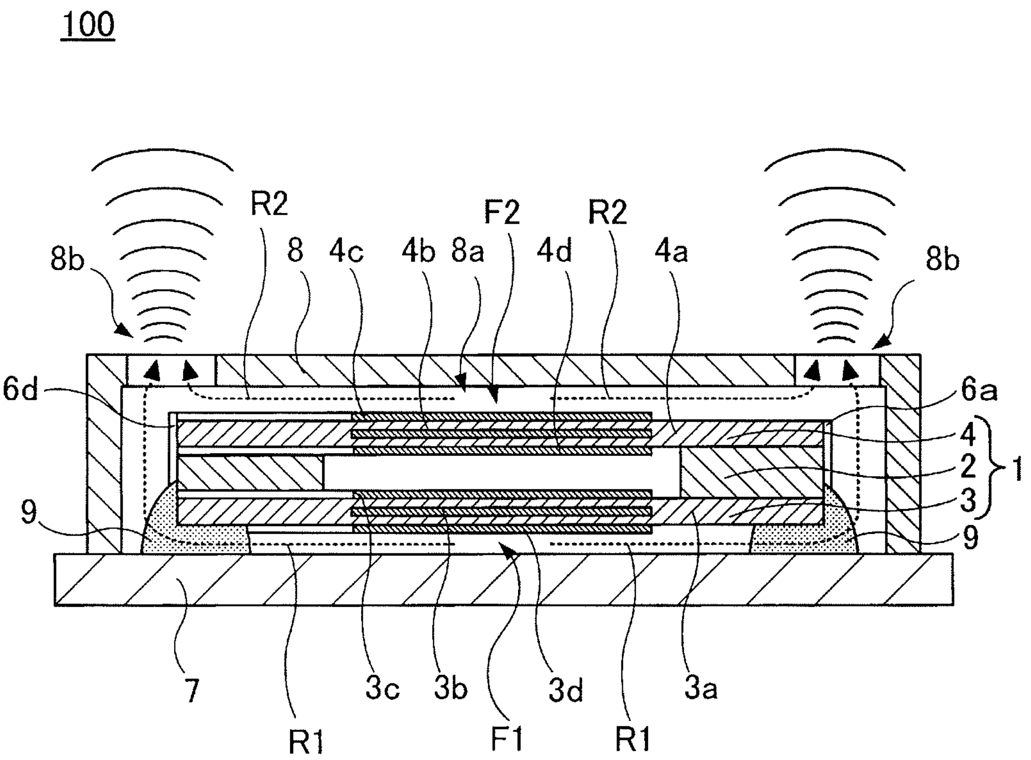
FIG. 2 is a cross-sectional view of the ultrasonic generation device 100 according to the embodiment of the present invention, taken along chain line X-X of FIG. 1.
Figure 3:
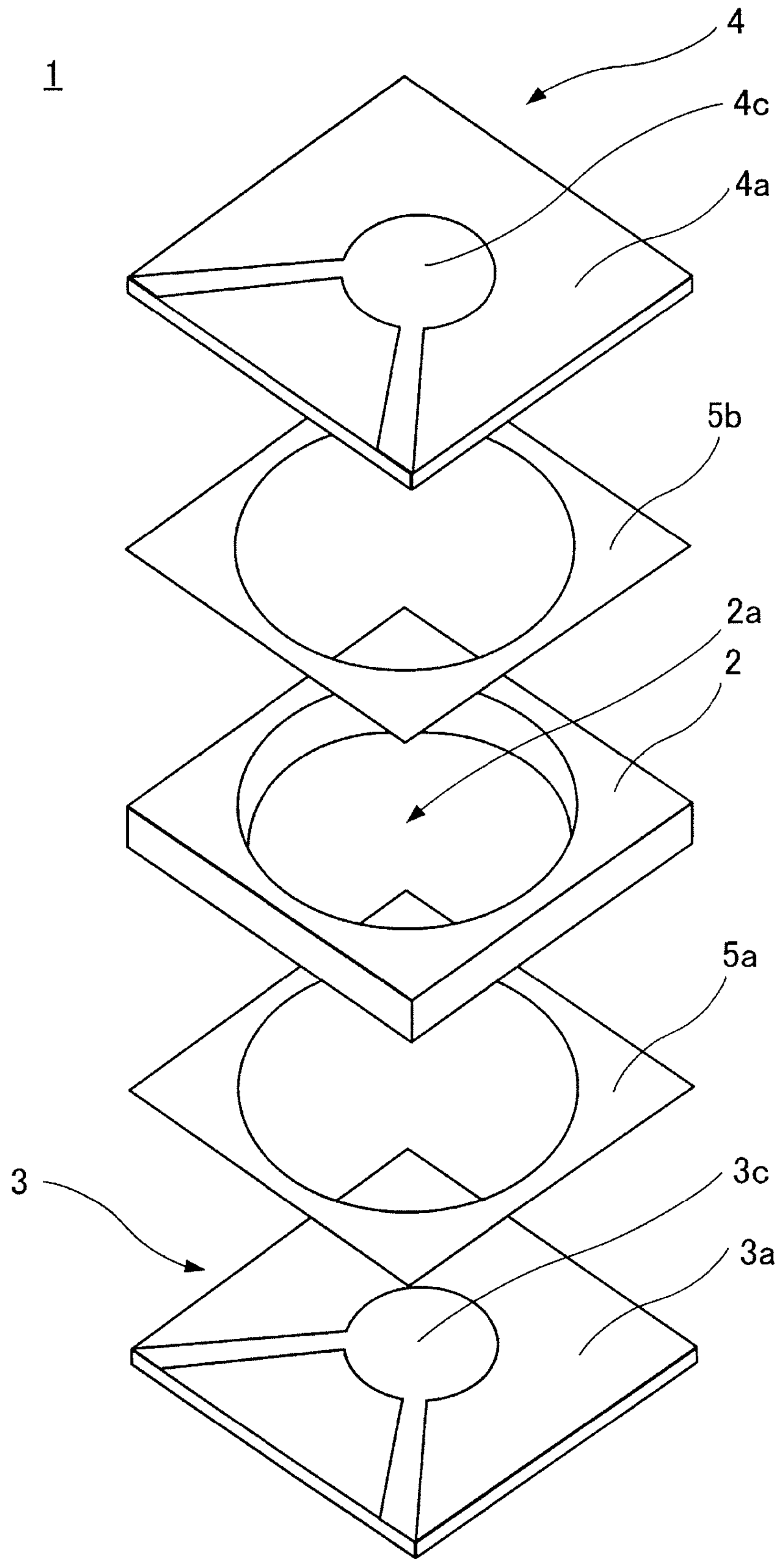
FIG. 3 is an exploded perspective view of an ultrasonic generation element 1 used in the ultrasonic generation device 100 according to the embodiment of the present invention.

FIGS. 1 and 2 illustrate an ultrasonic generation device 100 according to an embodiment of the present invention. FIG. 1 is a perspective view, and FIG. 2 is a cross-sectional view taken along chain line X-X of FIG. 1. FIG. 3 illustrates an ultrasonic generation element 1 used in the ultrasonic generation device 100. FIG. 3 is an exploded perspective view.

The ultrasonic generation device 100 includes the ultrasonic generation element 1.

The ultrasonic generation element 1 includes a frame 2, a first bimorph piezoelectric vibrator 3, and a second bimorph piezoelectric vibrator 4. The frame 2 has a through hole 2*a* in its center portion. The first bimorph piezoelectric vibrator 3 is bonded to a lower principal surface of the frame 2 with an adhesive 5*a*, and the second bimorph piezoelectric vibrator 4 is bonded to an upper principal surface of the frame 2 with an adhesive 5*b*. That is, the through hole 2*a* of the frame 2 is covered with the first bimorph piezoelectric vibrator 3 and the second bimorph piezoelectric vibrator 4. The ultrasonic generation element 1 has a thickness of about 320 μm, for example.

The frame 2 is formed of, for example, a ceramic material (glass epoxy is adopted now), and has a thickness of about 200 μm. The diameter of the through hole 2*a* is about 2.4 mm, for example. Instead of the through hole 2*a*, a groove may be provided in the center portion of the frame 2. That is, the frame 2 is not limited to a closed annular structure, but may be an annular structure that is partly open.

The first bimorph piezoelectric vibrator 3 includes piezoelectric ceramics 3*a* shaped like a rectangular flat plate and formed of, for example, lead zirconate titanate (PZT). An inner electrode 3*b* is provided within the piezoelectric ceramics 3*a*, and outer electrodes 3*c* and 3*d* are provided on both principal surfaces of the piezoelectric ceramics 3*a*, respectively. For example, the inner electrode 3*b* and the outer electrodes 3*c* and 3*d* are formed of Ag or Pd. The inner electrode 3*b* is extended to two adjacent corners of the piezoelectric ceramics 3*a*. In contrast, each of the outer electrodes 3*c* and 3*d* is extended to two adjacent corners of the piezoelectric ceramics 3*a* where the inner electrode 3*b* is not extended. The thickness of the first bimorph piezoelectric vibrator 3 is about 60 μm, for example.

Similarly to the first bimorph piezoelectric vibrator 3, the second bimorph piezoelectric vibrator 4 also includes piezoelectric ceramics 4*a* shaped like a rectangular flat plate and formed of, for example, PZT. An inner electrode 4*b* is provided within the piezoelectric ceramics 4*a*, and outer electrodes 4*c* and 4*d* are provided on both principal surfaces of the piezoelectric ceramics 4*a*, respectively. The inner electrode 4*b* and the outer electrodes 4*c* and 4*d* are also formed of Ag or Pd, for example. The inner electrode 4*b* is extended to two adjacent corners of the piezoelectric ceramics 4*a*. In contrast, each of the outer electrodes 4*c* and 4*d* is extended to two adjacent corners of the piezoelectric ceramics 4*a* where the inner electrode 4*b* is not extended. The thickness of the second bimorph piezoelectric vibrator 4 is also about 60 μm, for example.

The piezoelectric ceramics 3*a* of the first bimorph piezoelectric vibrator 3 and the piezoelectric ceramics 4*a* of the second bimorph piezoelectric vibrator 4 are each polarized therein. In the piezoelectric ceramics 3*a*, the direction of polarization is the same between the outer electrode 3*c* and the inner electrode 3*b* and between the inner electrode 3*b* and the outer electrode 3*d*. Similarly, in the piezoelectric ceramics 4*a*, the direction of polarization is the same between the outer electrode 4*c* and the inner electrode 4*b* and between the inner electrode 4*b* and the outer electrode 4*d*. In contrast, the direction of polarization between the outer electrode 3*c* and the inner electrode 3*b* and between the inner electrode 3*b* and the outer electrode 3*d* in the piezoelectric ceramics 3*a* is opposite from the direction of polarization between the outer electrode 4*c* and the inner electrode 4*b* and between the inner electrode 4*b* and the outer electrode 4*d* in the piezoelectric ceramics 4*a*.

Extended electrodes 6*a*, 6*b*, 6*c*, and 6*d* are provided at four corners of the ultrasonic generation element 1, respectively. Two adjacent extended electrodes 6*a* and 6*b* are electrically connected to the inner electrode 3*b* of the piezoelectric ceramics 3*a* and the inner electrode 4*b* of the piezoelectric ceramics 4*a*. In contrast, two remaining adjacent extended electrodes 6*c* and 6*d* are electrically connected to the outer electrodes 3*c* and 3*d* of the piezoelectric ceramics 3*a* and the outer electrodes 4*c* and 4*d* of the piezoelectric ceramics 4*a*. (While the extended electrodes 6*a* and 6*d* are illustrated in FIG. 2, illustrations of the extended electrodes 6*b* and 6*c* are omitted, and the extended electrodes 6*b* and 6*c* are not illustrated in any of the drawings.) The extended electrodes 6*a*, 6*b*, 6*c*, and 6*d* are formed of Ag, for example.

The ultrasonic generation device 100 further includes a housing composed of a substrate 7 and a cover member 8.

The substrate 7 is formed of, for example, glass epoxy, and is shaped like a rectangular flat plate. A plurality of land electrodes (not illustrated) are provided on an upper principal surface of the substrate 7. The ultrasonic generation element 1 is mounted on the substrate 7 by bonding the extended electrodes 6*a*, 6*b*, 6*c*, and 6*d* of the ultrasonic generation element 1 to the land electrodes with pillow members 9 formed of conductive adhesive. The ultrasonic generation element 1 is mounted on the substrate 7 with a fixed gap being disposed therebetween.

The cover member 8 is formed of, for example, nickel silver, and has an opening 8*a* that receives the ultrasonic generation element 1. The cover member 8 further has rectangular ultrasonic emission ports 8*b* in its top surface. While any number of ultrasonic emission ports 8*b* can be provided, four ultrasonic emission ports 8*b* are provided in the embodiment. The ultrasonic generation element 1 is received in the opening 8*a*, a peripheral edge of the opening 8*a* of the cover member 8 is bonded to the upper principal surface of the substrate 7, for example, with adhesive (not illustrated). The ultrasonic generation element 1 is mounted on the substrate 7 with a fixed gap being disposed between the ultrasonic generation element 1 and the cover member 8.

In the ultrasonic generation device 100, a first acoustic path R1 and a second acoustic path R2 are formed by the gaps provided between the ultrasonic generation element 1 and an inner surface of the housing composed of the substrate 7 and the cover member 8. The first bimorph piezoelectric vibrator 3 has a vibration surface F1 opposed to the inner surface of the housing. The second bimorph piezoelectric vibrator 4 has a vibration surface F2 opposed to the inner surface of the housing. The first acoustic path R1 extends from the vibration surface F1 of the first bimorph piezoelectric vibrator 3 to the ultrasonic emission ports 8*b*. The second acoustic path R2 extends from the vibration surface F2 of the second bimorph piezoelectric vibrator 4 to the ultrasonic emission ports 8*b*.

Since the ultrasonic generation element 1 is bonded at four corners to the substrate 7 with the pillow members 9, propagation of ultrasonic waves emitted from the ultrasonic generation element 1 is not hindered.

A description will now be given of a driving state of the ultrasonic generation device 100 of the embodiment (a driving state of the ultrasonic generation element 1).

Figure 4:
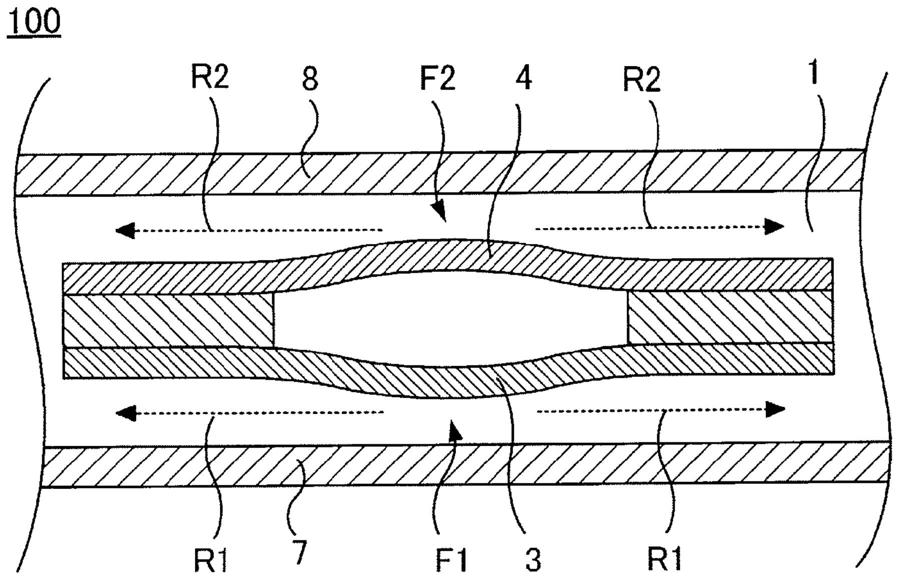
FIG. 4 includes explanatory views illustrating driving states of the ultrasonic generation device 100 according to the embodiment of the present invention.
Figure 4:
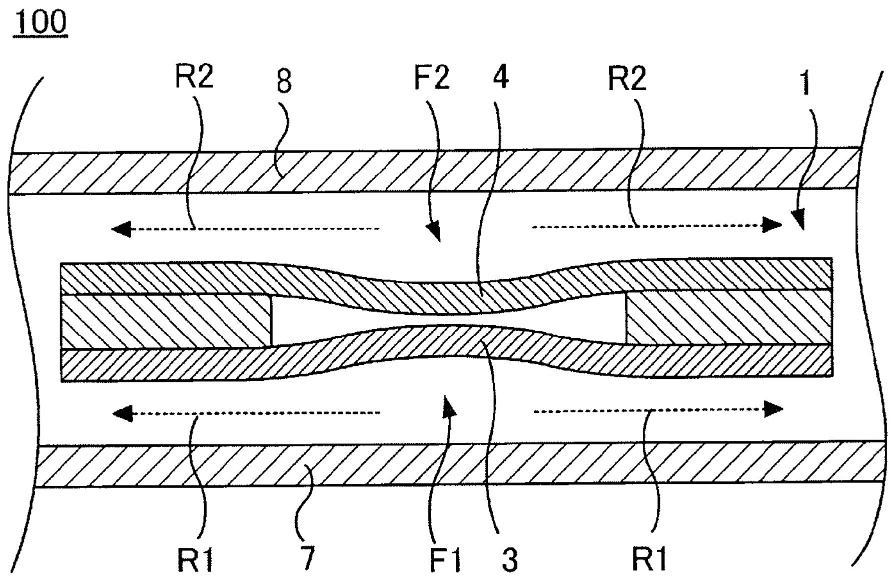

FIGS. 4(A) and 4(B) illustrate states in which a driving signal with a predetermined frequency is applied to the ultrasonic generation element 1 in the ultrasonic generation device 100.

The first bimorph piezoelectric vibrator 3 and the second bimorph piezoelectric vibrator 4 that constitute the ultrasonic generation element 1 include the inner electrodes 3*b* and 4*b* and the outer electrodes 3*c*, 3*d*, 4*c*, and 4*d*, as described above, and are polarized, as described above. Hence, when the driving signal is applied, the first bimorph piezoelectric vibrator 3 and the second bimorph piezoelectric vibrator 4 vibrate at the same frequency in mutually opposite phases, and repeat the states illustrated in FIGS. 4(A) and 4(B). That is, the ultrasonic generation element 1 vibrates in a buckling tuning-fork vibration mode, and emits ultrasonic waves from each of the first bimorph piezoelectric vibrator 3 and the second bimorph piezoelectric vibrator 4.

Ultrasonic waves emitted from the first bimorph piezoelectric vibrator 3 pass through the first acoustic path R1 and propagate to the ultrasonic emission ports 8*b*. Ultrasonic waves emitted from the second bimorph piezoelectric vibrator 4 pass through the second acoustic path R2, and propagate to the ultrasonic emission ports 8*b*. These ultrasonic waves are combined near the ultrasonic emission ports 8*b* to increase the output sound pressure, and are then emitted outside. In this way, the ultrasonic waves emitted from the two piezoelectric vibrators are combined in the ultrasonic generation device of the present invention. Hence, ultrasonic waves having a high output sound pressure can be emitted outside.

Figure 5:
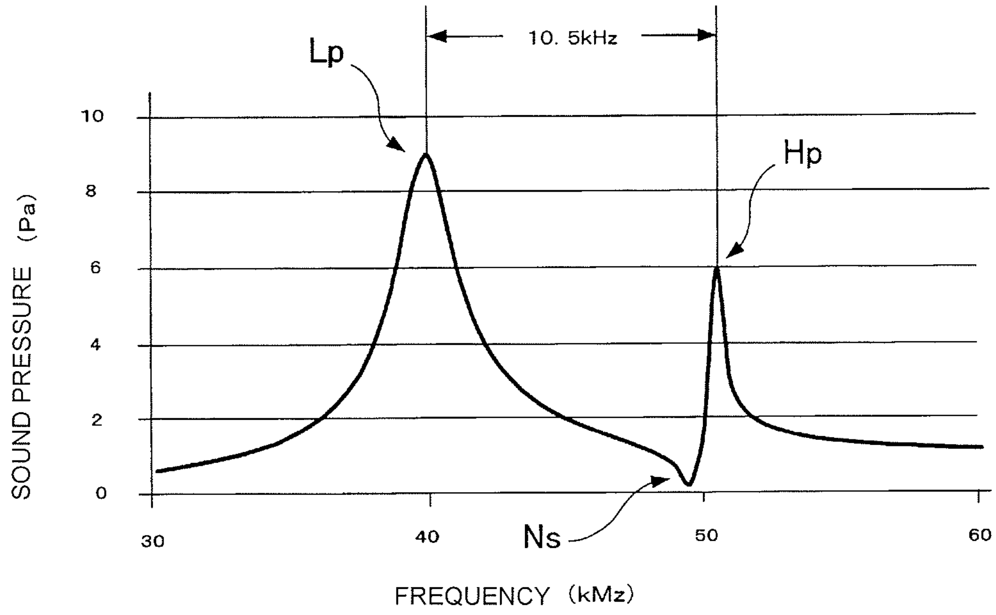
FIG. 5 is a graph showing the frequency-sound pressure characteristics of the ultrasonic generation device 100 according to the embodiment of the present invention.

FIG. 5 shows the frequency-sound pressure characteristics of the ultrasonic generation device 100 of the embodiment. The frequency represents a frequency of a driving signal to be applied to the ultrasonic generation element 1 (first bimorph piezoelectric vibrator 3, second bimorph piezoelectric vibrator 4). The sound pressure represents an output sound pressure of ultrasonic waves emitted from the ultrasonic emission ports 8*b*. As described above, the frequency-sound pressure characteristics are values calculated by FEM. However, since it is assumed that the amplitude of the vibrator is fixed over the entire frequency range to clarify the degree of influence of resonance, the influence of resonance of the vibrator is not reflected.

As shown in FIG. 5, in the frequency-sound pressure characteristics of the ultrasonic generation device 100, a low-frequency side peak Lp serving as a peak of sound pressure, where the output sound pressure becomes maximal, exists near 40 kHz, a high-frequency side peak Hp serving as a peak of sound pressure, where the output sound pressure becomes maximal, exists near 50.5 kHz, and an anacoustic zone Ns, where the output sound pressure becomes minimal, exists near 49 kHz.

The low-frequency side peak Lp is formed by resonance of air using the vicinity of the vibration surface F1 of the first bimorph piezoelectric vibrator 3 as an antinode and each of the ultrasonic emission ports 8*b* as a node. At this time, in the ultrasonic generation device 100, the sound pressure near the vibration surface F1 of the first bimorph piezoelectric vibrator 3 becomes the highest, and the sound pressure near the ultrasonic emission ports 8*b* becomes the lowest. Ultrasonic waves that are generated in the first bimorph piezoelectric vibrator 3 and propagate through the first acoustic path R1 and ultrasonic waves that are generated in the second bimorph piezoelectric vibrator 4 and propagate through the second acoustic path R2 are in phase with each other.

The anacoustic zone Ns is formed when the ultrasonic waves that are generated in the first bimorph piezoelectric vibrator 3 and propagate through the first acoustic path R1 and the ultrasonic waves that are generated in the second bimorph piezoelectric vibrator 4 and propagate through the second acoustic path R2 are opposite in phase.

The high-frequency side peak Hp is formed by resonance of air using the vicinity of the vibration surface F2 of the second bimorph piezoelectric vibrator 4 as an antinode and each of the pillow members 9 as a node. Although the resonance itself occurs within the ultrasonic generation device 100, since the vicinities of the ultrasonic emission ports 8*b* are open ends, ultrasonic waves having a comparatively high sound pressure are emitted from the ultrasonic emission ports 8*b*. At this time, in the ultrasonic generation device 100, the sound pressure near the vibration surface F2 of the second bimorph piezoelectric vibrator 4 becomes the highest, and the sound pressure near the pillow members 9 becomes the lowest. The ultrasonic waves that are generated in the first bimorph piezoelectric vibrator 3 and propagate through the first acoustic path R1 and the ultrasonic waves that are generated in the second bimorph piezoelectric vibrator 4 and propagate through the second acoustic path R2 are opposite in phase.

The ultrasonic generation device 100 (ultrasonic generation element 1) most efficiently emits ultrasonic waves when being driven at a frequency near 40 kHz serving as the low-frequency side peak Lp where the output sound pressure becomes maximal.

In the present invention, the frequency difference between the low-frequency side peak Lp and the high-frequency side peak Hp is set at 10 kHz or more. In the embodiment, the frequency difference between the low-frequency side peak Lp and the high-frequency side peak Hp is set at 10.5 kHz. In this case, the frequency of the acoustic zone Ns is sufficiently apart from the frequency of the driving signal for driving the ultrasonic generation device 100 (ultrasonic generation element 1). Hence, the output sound pressure does not rapidly fall, for example, even if the temperature of the usage environment changes.

The reason why the output sound pressure of the ultrasonic generation device changes with a change in temperature of the usage environment is as follows. That is, the output sound pressure of the ultrasonic generation device is greatly influenced by resonance of air occurring in the acoustic paths of the ultrasonic generation device. The frequency at which the resonance occurs changes with acoustic velocity, and the acoustic velocity changes with temperature. That is, since the acoustic velocity (m/s) is expressed by 331.5+0.61 t (t: degrees C.), for example, when the temperature of the usage environment falls, the acoustic velocity decreases, and the frequencies of the low-frequency side peak Lp, the anacoustic zone Ns, and the high-frequency side peak Hp also decrease totally. However, the frequency of the driving signal for driving the ultrasonic generation device 100 (ultrasonic generation element 1), which is initially set at a frequency near the low-frequency side peak Lp, does not change even if the temperature of the usage environment changes. As a result, the frequency of the driving signal approaches the frequency of the anacoustic zone Ns, and thus, the output sound pressure falls rapidly.

Figure 6:
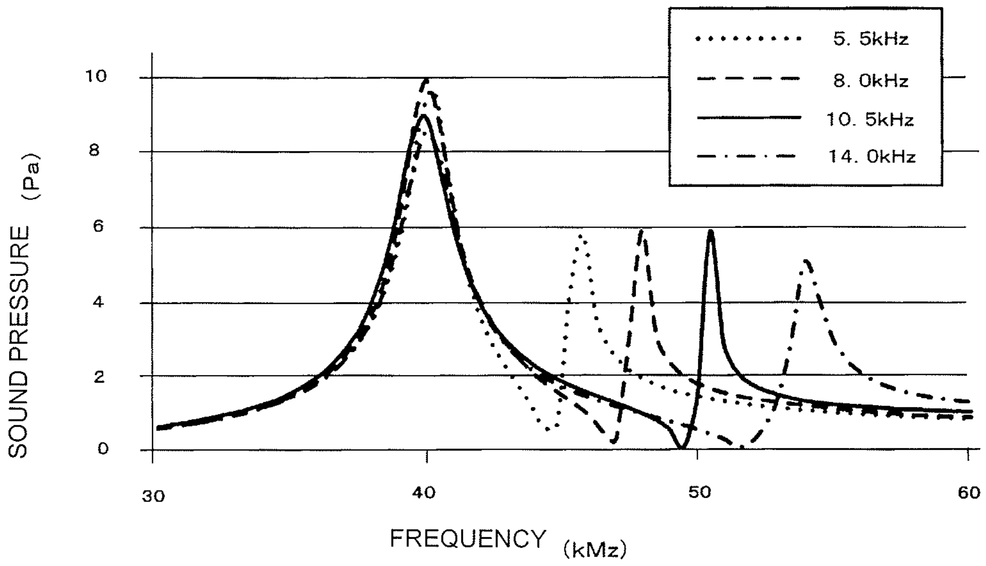
FIG. 6 is a graph showing the frequency-sound pressure characteristics when the frequency difference between two sound pressure peaks is changed in the ultrasonic generation device.

FIG. 6 shows the frequency-sound pressure characteristics when the frequency difference between the low-frequency side peak Lp and the high-frequency side peak Hp is changed in an ultrasonic generation device having a structure similar to that adopted in the embodiment. As shown in FIG. 6, when the frequency difference between the low-frequency side peak Lp and the high-frequency side peak Hp is 5.5 kHz or 8.0 kHz, the frequency of the driving signal for driving the ultrasonic generation device (frequency near the low-frequency side peak Lp) is close to the frequency of the anacoustic zone Ns. In contrast, when the frequency difference between the low-frequency side peak Lp and the high-frequency side peak Hp is 10.5 kHz or 14.0 kHz, the frequency of the driving signal for driving the ultrasonic generation device (frequency near the low-frequency side peak Lp) is sufficiently apart from the frequency of the anacoustic zone Ns.

Figure 7:
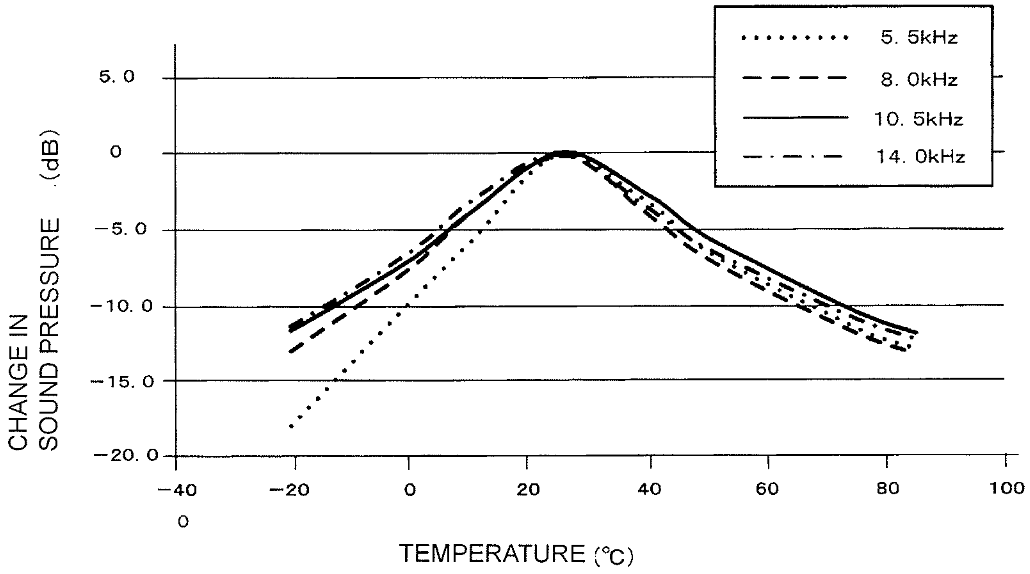
FIG. 7 is a graph showing the temperature-sound pressure characteristics when the frequency difference between two sound pressure peaks is changed in the ultrasonic generation device.

FIG. 7 shows the sound pressure change amounts at temperatures when the frequency difference between the low-frequency side peak Lp and the high-frequency side peak Hp is changed in the ultrasonic generation device having a structure that conforms to that adopted in the embodiment. In FIG. 7, the output sound pressure of the ultrasonic generation device when the temperature of the usage environment is 25° C. is used as the reference.

As shown in FIG. 7, in a case in which the frequency difference between the low-frequency side peak Lp and the high-frequency side peak Hp is 5.5 kHz or 8.0 kHz, when the temperature of the usage environment falls, the output sound pressure falls more than in other examples. For example, in a case in which the frequency difference between the low-frequency side peak Lp and the high-frequency side peak Hp is 5.5 kHz, when the temperature of the usage environment falls to 20° C. or less, the output sound pressure falls more than in the other examples. In a case in which the frequency difference between the low-frequency side peak Lp and the high-frequency side peak Hp is 8.0 kHz, when the temperature of the usage environment falls to 0° C. or less, the output sound pressure falls more than in the other examples. This seems because, when the temperature of the usage environment falls, the frequency of the anacoustic zone Ns approaches the frequency of the driving signal (frequency near the low-frequency side peak Lp) and the output sound pressure falls.

In contrast, when the frequency difference between the low-frequency side peak Lp and the high-frequency side peak Hp is 10.5 kHz or 14.0 kHz, even if the temperature of the usage environment falls, the output sound pressure falls less than when the frequency difference is 5.5 kHz or 8.0 kHz. This seems because, even if the frequency of the anacoustic zone Ns approaches the frequency of the driving signal (frequency near the low-frequency side peak Lp) with a fall in temperature of the usage environment, the output sound pressure does not fall since both the frequencies are sufficiently apart from each other.

It is known from the above that, when the frequency difference between the low-frequency side peak Lp and the high-frequency side peak Hp is set at 10 kHz or more as in the present invention, even if the temperature of the usage environment changes, the output sound pressure does not fall and a stable output sound pressure can be obtained.

Next, a description will be given of a method for setting the frequency difference between the low-frequency side peak Lp and the high-frequency side peak Hp at 10 kHz or more in the present invention. To set the frequency difference between the low-frequency side peak Lp and the high-frequency side peak Hp at 10 kHz or more in the present invention, it is only necessary to adjust (design) the dimensions of the members and parts that constitute the ultrasonic generation device so that each of the frequency of the low-frequency side peak Lp and the frequency of the high-frequency side peak Lp takes a desired value.

The low-frequency side peak Lp can be set at a desired frequency by adjusting the length of the acoustic path (first acoustic path R1) from the vicinity of the vibration surface F1 of the first bimorph piezoelectric vibrator 3 to the vicinity of the ultrasonic emission ports **8*b* or the size or shape of the ultrasonic emission ports 8*b*. Specifically, the frequency of the low-frequency side peak Lp can be moved to a lower side by increasing the length of the acoustic path (first acoustic path R1) from the vicinity of the vibration surface F1 of the first bimorph piezoelectric vibrator 3 to the vicinity of the ultrasonic emission ports 8*b*. Alternatively, the frequency of the low-frequency side peak Lp can be moved to the lower side by reducing the size of the ultrasonic emission ports 8*b***.

The high-frequency side peak Hp can be set at a desired frequency by adjusting the size of the ultrasonic generation element 1 or the housing. Specifically, the frequency of the high-frequency side peak Hp can be moved to a lower side by increasing the size of the ultrasonic generation element 1 or the housing.

Figure 8:
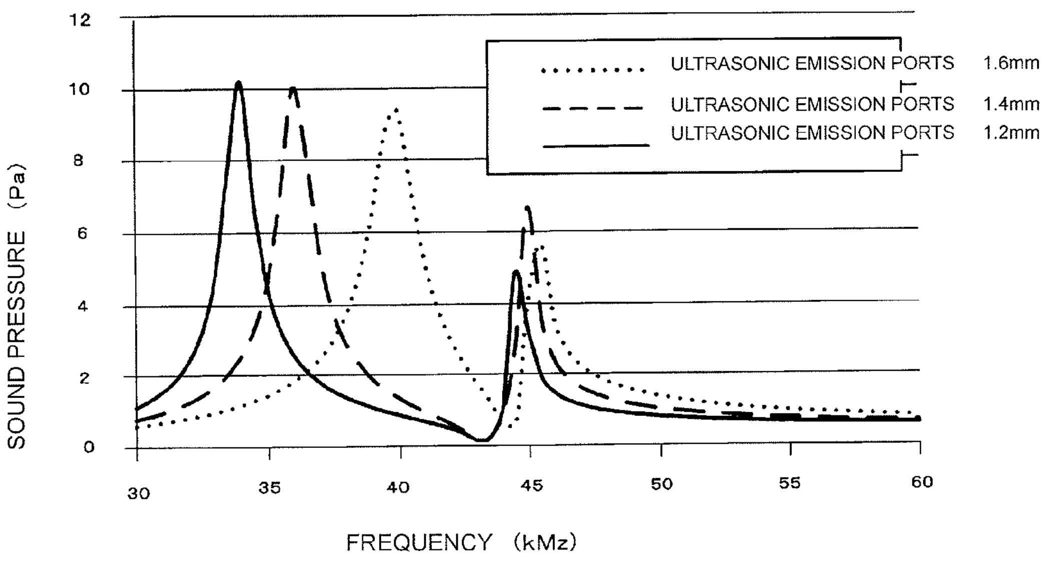
FIG. 8 is a graph showing the frequency-sound pressure characteristics when the size of ultrasonic emission ports is changed in the ultrasonic generation device.

FIG. 8 shows the frequency-sound pressure characteristics when the size of the ultrasonic emission ports is changed in the ultrasonic generation device having a structure similar to that adopted in the embodiment. Here, the ultrasonic emission ports are square in plan view, and the length of each side of the ultrasonic emission ports is changed. Other dimensions are fixed. As shown in FIG. 8, as the size of the ultrasonic emission ports is reduced by shortening each side of the ultrasonic emission ports from 1.6 mm to 1.4 mm, and further from 1.4 mm to 1.2 mm, the frequency of the low-frequency side peak Lp and the frequency of the high-frequency side peak Hp move to the lower side.

Figure 9:
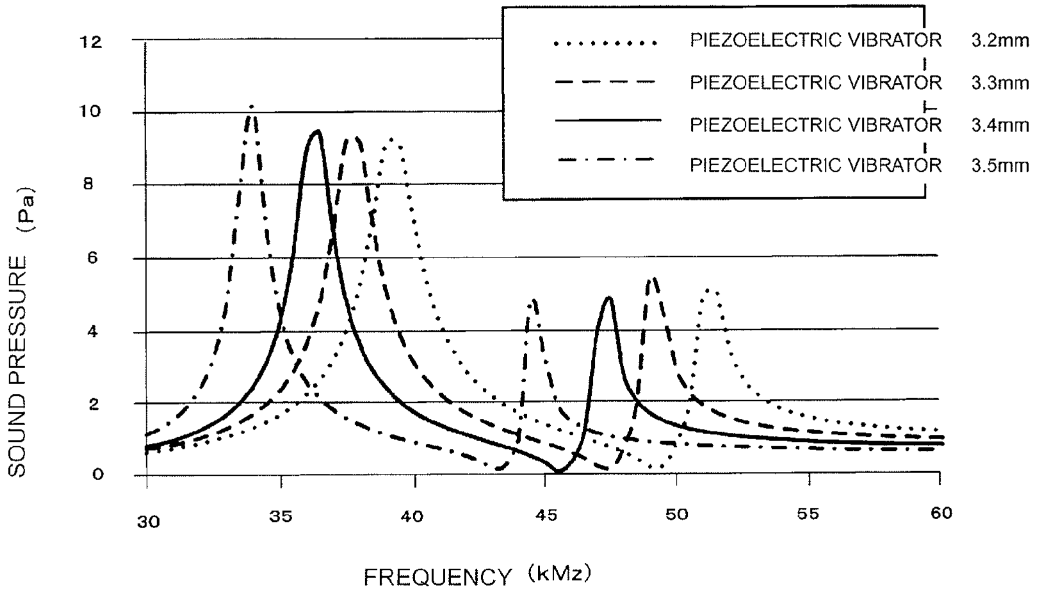
FIG. 9 is a graph showing the frequency-sound pressure characteristics when the size of a piezoelectric vibrator is changed in the ultrasonic generation device.
Figure 10:
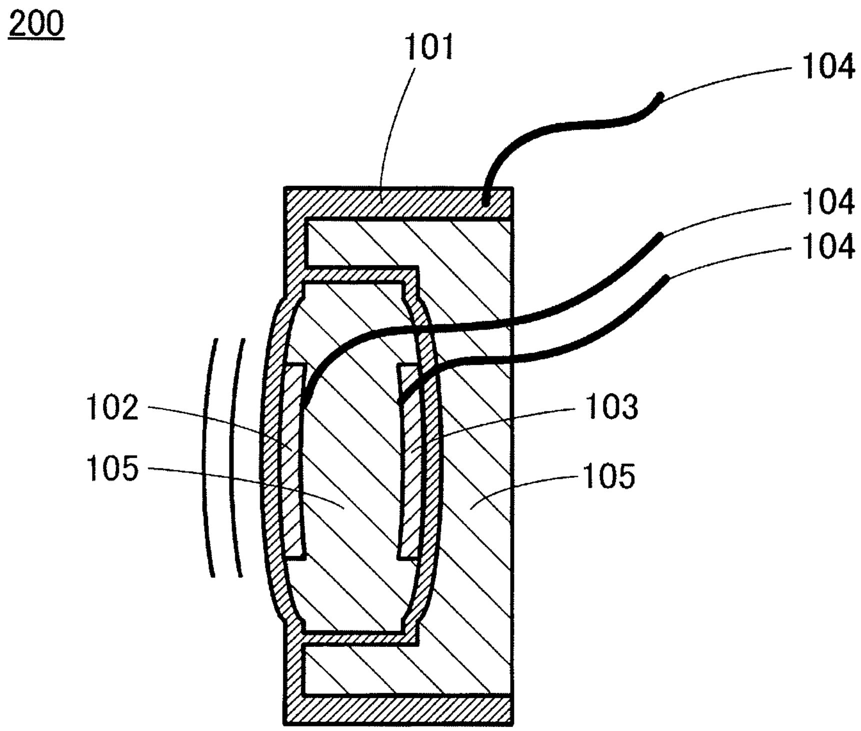
FIG. 10 is a cross-sectional view of a conventional ultrasonic generation device 200.
Figure 11:
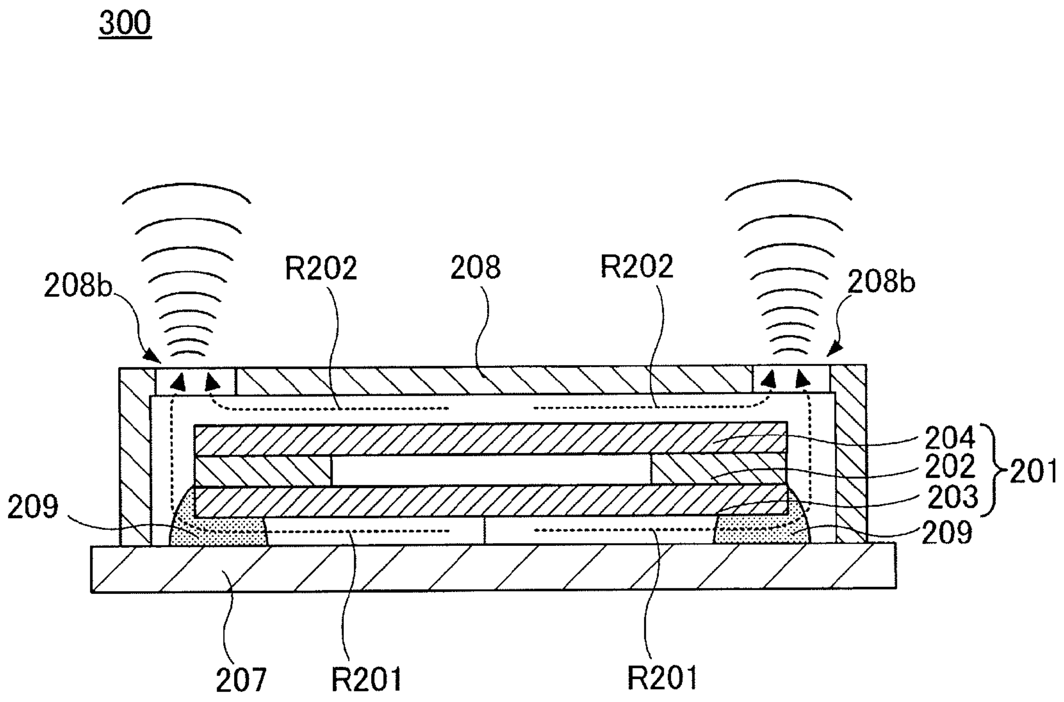
FIG. 11 is a simple cross-sectional view of an ultrasonic generation device 300 whose patent application has already been filed by the present applicant (not laid open).
Figure 12:
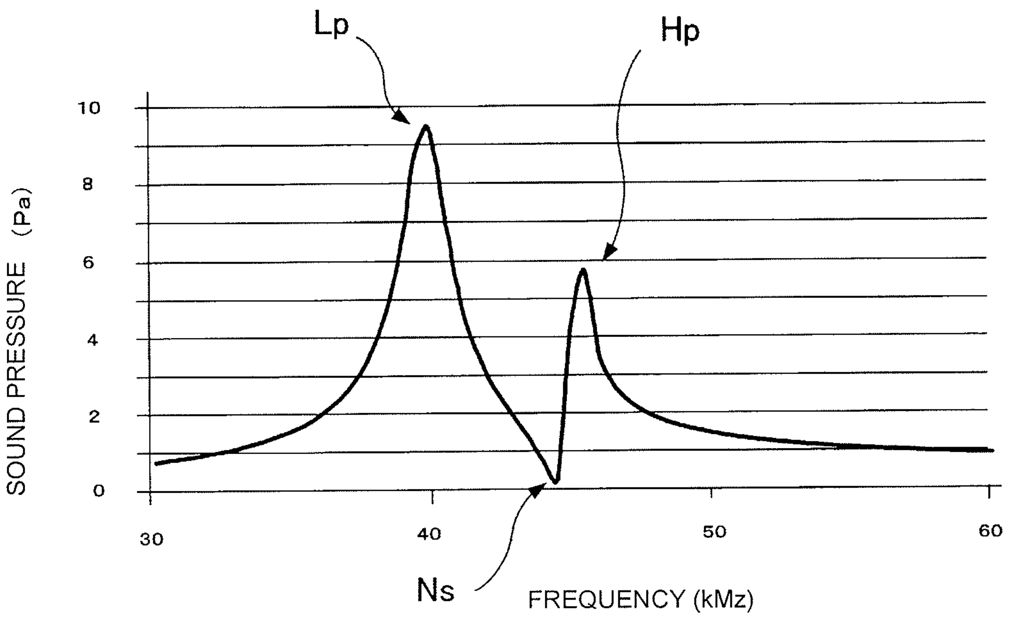
FIG. 12 is a graph showing the frequency-sound pressure characteristics of the ultrasonic generation device 300 whose patent application has already been filed by the present applicant (not laid open).

FIG. 9 shows the frequency-sound pressure characteristics when the size of the first bimorph piezoelectric vibrator and the second bimorph piezoelectric vibrator (that is, ultrasonic generation element) is changed in the ultrasonic generation device having a structure similar to that adopted in the embodiment. Here, the first bimorph piezoelectric vibrator and the second bimorph piezoelectric vibrator are square in plan view, and the length of each side of the vibrators is changed. Other dimensions are fixed. As shown in FIG. 9, as the length of each side of the first bimorph piezoelectric vibrator and the second bimorph piezoelectric vibrator increases from 3.2 mm to 3.3 mm, from 3.3 mm to 3.4 mm, and from 3.4 mm to 3.5 mm, the frequency of the low-frequency side peak Lp and the frequency of the high-frequency side peak Hp move to the lower side. This seems because, when the size of the ultrasonic generation element is increased by increasing the size of each of the piezoelectric vibrators, the resonance paths are lengthened and this decreases the resonance frequencies.

When the frequency of the high-frequency side peak Hp is moved by adjusting the size of the ultrasonic generation element or the housing, the frequency of the low-frequency side peak Lp also moves. Specifically, when the frequency of the high-frequency side peak Hp is moved to the lower side by adjusting the size of the ultrasonic generation element or the housing, the frequency of the low-frequency side peak Lp also moves to the lower side. That is, when the dimensions of the members and parts that constitute the ultrasonic generation device are adjusted to move the frequency of the high-frequency side peak Hp, the frequency of the low-frequency side peak Lp is also influenced. Therefore, the frequency of the high-frequency side peak Hp and the frequency of the low-frequency side peak Lp are preferably adjusted not by only the size of the ultrasonic generation element or the housing, by a combination of the size of the ultrasonic generation element or the housing and the size or shape of the ultrasonic emission ports. Specifically, for example, the frequency difference between the low-frequency side peak Lp and the high-frequency side peak Hp may be controlled by adjusting the size or shape of the ultrasonic emission ports, and the frequency of the low-frequency side peak Lp may be controlled by adjusting the size of the ultrasonic generation element or the housing.

The ultrasonic generation device 100 having the above-described structure according to the embodiment of the present invention is manufactured by the following method, for example.

First, the first bimorph piezoelectric vibrator 3 and the second bimorph piezoelectric vibrator 4 are produced. Specifically, a plurality of piezoelectric ceramic green sheets each having a predetermined shape are prepared, and conductive paste for forming the inner electrodes 3*b* and 4*b* and the outer electrodes 3*c*, 3*d*, 4*c*, and 4*d* is printed on surfaces of the piezoelectric ceramic green sheets in a predetermined shape. Next, the predetermined piezoelectric ceramic green sheets are stacked, pressed, and fired at a predetermined profile, and the first bimorph piezoelectric vibrator 3 with the inner electrode 3*b* and the outer electrodes 3*c* and 3*d* and the second bimorph piezoelectric vibrator 4 with the inner electrode 4*b* and the outer electrodes 4*c* and 4*d* are obtained. The outer electrodes 3*c*, 3*d*, 4*c*, and 4*d* may be formed by printing or sputtering after the stacked piezoelectric ceramic green sheets are fired.

Next, the frame 2 previously formed in a predetermined shape is prepared, and the first bimorph piezoelectric vibrator 3 and the second bimorph piezoelectric vibrator 4 are bonded to both principal surfaces of the frame 2 with the adhesives 5*a* and 5*b*, respectively, so that the ultrasonic generation element 1 is obtained.

Next, the extended electrodes 6*a*, 6*b*, 6*c*, and 6*d* are formed at four corners of the ultrasonic generation element 1 by a technique such as sputtering.

Next, the substrate 7 and the cover member 8 each previously formed in a predetermined shape are prepared, the ultrasonic generation element 1 is mounted on the substrate 7 with the conductive adhesive 9, and the cover member 8 is bonded to the upper principal surface of the substrate 7 with adhesive (not illustrated), so that the ultrasonic generation device 100 is completed.

The structure, the driving state, and the exemplary manufacturing method for the ultrasonic generation device 100 according to the first embodiment of the present invention have been described above. However, the ultrasonic generation device of the present invention is not limited to the above description, and various changes can be made in accordance with the purport of the invention.

For example, the first and second vibrators that constitute the ultrasonic generation element 1 may be vibrators of other types, such as unimorph piezoelectric vibrators or multimorph piezoelectric vibrators, instead of the first and second bimorph piezoelectric vibrators 3 and 4.

REFERENCE SIGNS LIST

1 ultrasonic generation element
2 frame
2*a* through hole
3 first bimorph piezoelectric vibrator
4 second bimorph piezoelectric vibrator
3*a*, 4*a* piezoelectric ceramics
3*b*, 4*b* inner electrode
3*c*, 3*d*, 4*c*, 4*d* outer electrode
5*a*, 5*b* adhesive
6*a*, 6*b*, 6*c*, 6*d* extended electrode
7 substrate
8 cover member
8*a* opening
8*b* ultrasonic emission port
9 pillow member
100 ultrasonic generation device
F1 vibration surface of first bimorph piezoelectric vibrator 3
F2 vibration surface of second bimorph piezoelectric vibrator 4
R1 first acoustic path
R2 second acoustic path

The invention claimed is:

1. An ultrasonic generation device comprising:
   a housing having at least one ultrasonic emission port; and
   an ultrasonic generation element disposed in the housing, the ultrasonic generation element including:
      a frame having first and second surfaces and a through hole in a center portion thereof,
      a first planar piezoelectric vibrator bonded to the first surface of the frame, and
      a second planar piezoelectric vibrator bonded to the second surface of the frame, wherein the ultrasonic generation element is configured to emit ultrasonic waves in a buckling tuning-fork vibration mode such that the first and second planar piezoelectric vibrators vibrate in mutually opposite phases at a vibration frequency, wherein the ultrasonic generation element is disposed in the housing to define a first acoustic path that extends from a vibration surface of the first planar piezoelectric vibrator to the at least one ultrasonic emission port and a second acoustic path that extends from the second planar piezoelectric vibrator to the at least one ultrasonic emission port.

2. The ultrasonic generation device according to claim 1, wherein frequency-sound pressure characteristics representing a relationship between the vibration frequency and an output sound pressure of the ultrasonic waves emitted from the at least one ultrasonic emission port include a low-frequency side peak and a high-frequency side peak.

3. The ultrasonic generation device according to claim 1, wherein the low-frequency side peak and the high-frequency side peak have a frequency difference of at least 10 kHz.

4. The ultrasonic generation device according to claim 1, wherein the housing comprises a substrate and a cover member with a peripheral edge bonded to the substrate.

5. The ultrasonic generation device according to claim 4, wherein the ultrasonic generation element is disposed on the substrate.

6. The ultrasonic generation device according to claim 5, further comprising a plurality of pillow members disposed between the ultrasonic generation element and the substrate to form a fixed gap therebetween.

7. The ultrasonic generation device according to claim 4, wherein the cover members comprises an opening configured to receive the ultrasonic generation element.

8. The ultrasonic generation device according to claim 4, wherein the at least one ultrasonic emission port is disposed in the cover member.

9. The ultrasonic generation device according to claim 1, wherein the first surface is a lower surface of the frame, and the second surface is an upper surface of the frame.

10. The ultrasonic generation device according to claim 2, wherein the frequency-sound pressure characteristics includes an anacoustic zone between the low-frequency side peak and the high-frequency side peak where the output sound pressure becomes minimal.

11. The ultrasonic generation device according to claim 6, wherein the low-frequency side peak is formed by resonance of air with a vicinity of the vibration surface of the first planar piezoelectric vibrator as an antinode and a vicinity of the at least one ultrasonic emission port as a node.

12. The ultrasonic generation device according to claim 11, wherein the high-frequency side peak is formed by resonance of air with a vicinity of the vibration surface of the second piezoelectric vibrator as an antinode and a vicinity of the pillow members as a node.

13. The ultrasonic generation device according to claim 1, wherein the first and second planar piezoelectric vibrators are multimorph piezoelectric vibrators.

14. The ultrasonic generation device according to claim 13, wherein the multimorph piezoelectric vibrators are bimorph piezoelectric vibrators.

15. The ultrasonic generation device according to claim 1, wherein each of the first and second planar piezoelectric vibrators comprises an internal electrode and a pair of external electrodes disposed on upper and lower surfaces of the respective planar piezoelectric vibrator.

16. The ultrasonic generation device according to claim 15, wherein at least a portion of each of the internal electrodes and pairs of external electrodes are disposed in the through hole of the frame.

17. The ultrasonic generation device according to claim 15, further comprising four extended electrodes disposed on four corner portions of each of the first and second planar piezoelectric vibrators.

18. The ultrasonic generation device according to claim 17, wherein the four extended electrodes are electrically coupled to the pairs of external electrodes of the first and second planar piezoelectric vibrators.

19. The ultrasonic generation device according to claim 15, wherein the first planar piezoelectric vibrator is polarized and the direction of polarization between the internal electrode and a first external electrode of the pair of external electrodes and the direction of polarization between the internal electrode and a second external electrode of the pair of external electrodes is the same direction, and wherein the second planar piezoelectric vibrator is polarized and the direction of polarization between the internal electrode and a first external electrode of the pair of external electrodes and the direction of polarization between the internal electrode and a second external electrode of the pair of external electrodes is the same direction.

20. The ultrasonic generation device according to claim 19, wherein the direction of polarization of the first planar piezoelectric vibrator is opposite to the direction of polarization of the second planer piezoelectric vibrator.

* * * * *